US011789087B2

(12) United States Patent
Kondo

(10) Patent No.: US 11,789,087 B2
(45) Date of Patent: Oct. 17, 2023

(54) BATTERY CHARGE SUPPORT SYSTEM FOR REDUCING ENERGY LOSS

(71) Applicant: SEMICONDUCTOR COMPONENTS INDUSTRIES, LLC, Phoenix, AZ (US)

(72) Inventor: Hideo Kondo, Oizumi-machi (JP)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 72 days.

(21) Appl. No.: 17/190,938

(22) Filed: Mar. 3, 2021

(65) Prior Publication Data

US 2022/0283237 A1 Sep. 8, 2022

(51) Int. Cl.
*G01R 31/3842* (2019.01)
*G01R 31/374* (2019.01)
*G01R 31/36* (2020.01)
*G01R 31/367* (2019.01)
*H01M 10/48* (2006.01)
*G05B 13/04* (2006.01)

(52) U.S. Cl.
CPC ....... *G01R 31/3842* (2019.01); *G01R 31/374* (2019.01); *H01M 10/486* (2013.01); *G01R 31/367* (2019.01); *G01R 31/3648* (2013.01); *G05B 13/041* (2013.01)

(58) Field of Classification Search
CPC .............. G01R 31/3842; G01R 31/374; G01R 31/3648; G01R 31/367
See application file for complete search history.

(56) References Cited

U.S. PATENT DOCUMENTS

| 2004/0135544 | A1 | 7/2004 | King et al. |
| 2004/0135546 | A1 | 7/2004 | Chertok et al. |
| 2011/0245987 | A1 | 10/2011 | Pratt et al. |
| 2012/0003535 | A1 | 1/2012 | Yamazaki |
| 2012/0176728 | A1 | 7/2012 | Aida et al. |
| 2012/0177986 | A1 | 7/2012 | Aida et al. |

(Continued)

FOREIGN PATENT DOCUMENTS

| CN | 107230810 A | * 10/2017 | ........ H01M 10/0525 |
| CN | 110323810 A | * 10/2019 | ............ H01M 10/44 |

(Continued)

OTHER PUBLICATIONS

Chen et al., "Loss-Minimization-Based Charging Strategy for Lithium-Ion Battery" IEEE Transactions On Industry Applications, vol. 51, No. 5, Sep./Oct. 2015 (Year: 2015).*

(Continued)

*Primary Examiner* — John C Kuan
(74) *Attorney, Agent, or Firm* — Brake Hughes Bellermann LLP

(57) ABSTRACT

According to an aspect, a battery system for controlling a charging current includes a temperature sensor configured to measure a temperature of a first battery, a state-of-charge (SoC) calculation engine configured to calculate an SoC value of the first battery, and a charge current controller configured to determine an adjusted current according to a charge profile based on the temperature and the SoC value, where the charge current controller is configured to transmit current data that indicates the adjusted current to a device.

20 Claims, 11 Drawing Sheets

(56) References Cited

U.S. PATENT DOCUMENTS

| | | |
|---|---|---|
| 2012/0200160 A1 | 8/2012 | Pratt et al. |
| 2012/0293129 A1 | 11/2012 | Naghshtabrizi et al. |
| 2013/0214724 A1 | 8/2013 | Schwartz |
| 2013/0234669 A1 | 9/2013 | Huang et al. |
| 2013/0245874 A1 | 9/2013 | Magnet et al. |
| 2013/0268132 A1 | 10/2013 | Pratt et al. |
| 2014/0011057 A1 | 1/2014 | Schaefer |
| 2014/0072836 A1 | 3/2014 | Mills |
| 2014/0091748 A1 | 4/2014 | Herman |
| 2014/0093760 A1 | 4/2014 | Hermann et al. |
| 2014/0095088 A1 | 4/2014 | Kwok et al. |
| 2014/0266061 A1 | 9/2014 | Wachal |
| 2014/0379284 A1* | 12/2014 | Heo .................. G01R 31/3648 702/63 |
| 2015/0108991 A1* | 4/2015 | Aoshima ............... G01R 31/374 324/430 |
| 2015/0231982 A1 | 8/2015 | Li et al. |
| 2015/0231985 A1 | 8/2015 | Li |
| 2015/0231986 A1 | 8/2015 | Li |
| 2015/0232083 A1 | 8/2015 | Yu et al. |
| 2015/0357640 A1 | 12/2015 | Yamazaki |
| 2017/0222437 A1 | 8/2017 | Pratt et al. |
| 2018/0358829 A1 | 12/2018 | Rastegar et al. |
| 2019/0305568 A1 | 10/2019 | Hand et al. |
| 2019/0356012 A1 | 11/2019 | Herman |
| 2019/0372359 A1 | 12/2019 | Gelso |
| 2020/0014055 A1 | 1/2020 | Hermann |
| 2020/0018798 A1 | 1/2020 | Ukumori et al. |
| 2020/0161696 A1 | 5/2020 | Hermann et al. |
| 2020/0176835 A1 | 6/2020 | Rastegar et al. |
| 2020/0176998 A1 | 6/2020 | Rastegar et al. |
| 2020/0176999 A1 | 6/2020 | Rastegar et al. |
| 2020/0217896 A1 | 7/2020 | Hatano et al. |
| 2020/0221228 A1* | 7/2020 | Trommer ............. H04R 1/1033 |
| 2021/0231739 A1* | 7/2021 | Hong ................. H01M 10/488 |
| 2021/0328449 A1* | 10/2021 | Li ....................... H01M 10/443 |
| 2022/0006313 A1* | 1/2022 | Lim .................... H02J 7/00714 |

FOREIGN PATENT DOCUMENTS

| | | | | |
|---|---|---|---|---|
| CN | 112103580 A | * | 12/2020 | ............ G06F 30/20 |
| CN | 112421717 A | * | 2/2021 | ............. B60L 58/12 |

OTHER PUBLICATIONS

Kim et al., "Adaptive Loss Reduction Charging Strategy Considering Variation of Internal Impedance of Lithium-Ion Polymer Batteries in Electric Vehicle Charging Systems" 2016 IEEE (Year: 2016).*

Ahn et al., "High-Efficiency Adaptive-Current Charging Strategy for Electric Vehicles Considering Variation of Internal Resistance of Lithium-Ion Battery" IEEE Transactions On Power Electronics, vol. 34, No. 4, Apr. 2019 (Year: 2019).*

Fang et al., "Lithium-ion Battery Charging Strategy for Electric Vehicles Based on Particle Swarm Optimization Method" 2017 IEEE (Year: 2017).*

* cited by examiner

BATTERY CHARGE SUPPORT SYSTEM FOR REDUCING ENERGY LOSS

TECHNICAL FIELD

This description relates to a battery charge support system for reducing energy loss.

BACKGROUND

In some examples, battery-to-battery charging may involve a charger having a first battery that charges a device with a second battery, where energy is transferred from the first battery to the second battery. In some examples, the second battery (and/or the first battery) may be rechargeable batteries such as, for example, lithium-ion (Li-ion) batteries. To recharge the batteries, the device may be inserted or connected to the charger having the first battery. In some examples, the charge process in which energy is transferred from the first battery to the second battery may be relatively inefficient, especially during fast charging situations.

SUMMARY

According to an aspect, a battery system for controlling a charging current includes a temperature sensor configured to measure a temperature of a first battery, a state-of-charge (SoC) calculation engine configured to calculate an SoC value of the first battery, and a charge current controller configured to determine an adjusted current according to a charge profile based on the temperature and the SoC value, where the charge current controller is configured to transmit current data that indicates the adjusted current to a device.

According to some aspects, the battery system may include one or more of the following features (or any combination thereof). The device may be an external charger configured to charge the first battery according to the charge profile. The device may include a second battery in which the first battery charges the second battery according to the charge profile. The battery system may include an energy calculation engine configured to compute charge energy loss using internal resistance values obtained from battery characteristic data, where the charge current controller is configured to generate the charge profile such that the charge energy loss is minimized. The battery system may include a current sensor configured to measure a charge current, a voltage monitor configured to measure a cell voltage of the first battery, and/or an energy calculation engine configured to compute actual charge energy loss associated with the first battery based on the cell voltage, the SoC value, and the measured charge current. The energy calculation engine is configured to transmit the actual charge energy loss to a battery manager. The energy calculation engine is configured to derive an open-cell voltage from the SoC value and/or compute the actual charge energy loss based on the measured charge current and a difference between the cell voltage and the open-cell voltage. The energy calculation engine is configured to derive an open-cell voltage from the SoC value, compute actual charge energy of the first battery based on the open-cell voltage and the measured charge current, compute total charge energy of the first battery based on the cell voltage and the measured charge current, and/or compute the actual charge energy loss based on the actual charge energy and the total charge energy. The battery system may include an energy calculation engine configured to derive an internal resistance of the first battery from battery characteristic data using the SoC value and the temperature, compute estimated charge energy loss for the first battery based on the internal resistance and the adjusted battery current from the charge profile, and/or transmit the estimated charge energy loss to a battery manager. The energy calculation engine is configured to compute charge energy loss of the first battery based on the internal resistance and a set value for the charge current, compute improved energy loss based on the estimated charge energy loss and the charge energy loss, and/or transmit the improved energy loss to the battery manager.

According to an aspect, a device includes a first battery, a temperature sensor configured to measure a temperature of the first battery, a state-of-charge (SoC) calculation engine configured to calculate an SoC value of the first battery, and a charge current controller configured to determine an adjusted current according to a charge profile based on the temperature and the SoC value, where the charge current controller is configured to transmit current data that indicates the adjusted current to a device.

According to some aspects, the device may include one or more of the following features (or any combination thereof). The device may include an energy calculation engine configured to compute charge energy loss using internal resistance values obtained from battery characteristic data, where the charge current controller is configured to generate the charge profile such that the charge energy loss is minimized. The device may include a current sensor configured to measure the adjusted current, a voltage monitor configured to measure a cell voltage of the battery, an energy calculation engine configured to compute actual charge energy loss for a sampling period based on the cell voltage, the SoC value, and the adjusted current, and a battery manager configured to receive, via an interface, the actual charge energy loss. The energy calculation engine is configured to derive an open-cell voltage from the SoC value and compute the actual charge energy loss based on the adjusted current and a difference between the cell voltage and the open-cell voltage. The energy calculation engine configured to derive an internal resistance of the battery from battery characteristic data using the SoC value and the temperature, and compute estimated charge energy loss for a sampling period based on the internal resistance and the adjusted battery current of the charge profile, where the battery manager is configured to receive, via the interface, the estimated charge energy loss and generate an alert based on a comparison of the estimated charge energy loss with the actual charge energy loss.

According to an aspect, a method for controlling a charging current includes measuring a temperature of a first battery, calculating an SoC value of the first battery, determining an adjusted current according to a charge profile based on the temperature and the SoC value, and transmitting current data that indicates the adjusted current to a device, the device being an external charger or an electronic device having a second battery.

According to some aspects, the method may include one or more of the following features (or any combination thereof). The method may include computing charge energy loss using internal resistance values obtained from battery characteristic data and generating the charge profile such that the charge energy loss is minimized. The method may include measuring a charge current, measuring a cell voltage of the battery, computing actual charge energy loss for a sampling period based on the cell voltage, the SoC value, and the measured charge current, and/or transmitting, via an interface, the actual charge energy loss to a battery manager. The method may include deriving an open-cell voltage from the SoC value and/or computing the actual charge energy loss based on the measured charge current and a difference between the cell voltage and the open-cell voltage. The method may include deriving an internal resistance of the battery from battery characteristic data using the SoC value and the temperature, computing estimated charge energy loss for the sampling period based on the internal resistance and the adjusted current of the charge profile, and/or generating an alert based on a comparison of the estimated charge energy loss with the actual charge energy loss. The adjusted current is increased during a first period of time and the adjusted current is decreased during a second period of time, where the second period time is separated from the first period of time by a time duration.

The details of one or more implementations are set forth in the accompanying drawings and the description below. Other features will be apparent from the description and drawings, and from the claims.

BRIEF DESCRIPTION OF THE DRAWINGS

FIG. 1I illustrates a graph depicting improved energy loss, charge energy loss, and estimated charge energy loss according to an aspect.

DETAILED DESCRIPTION

Figure 1A:
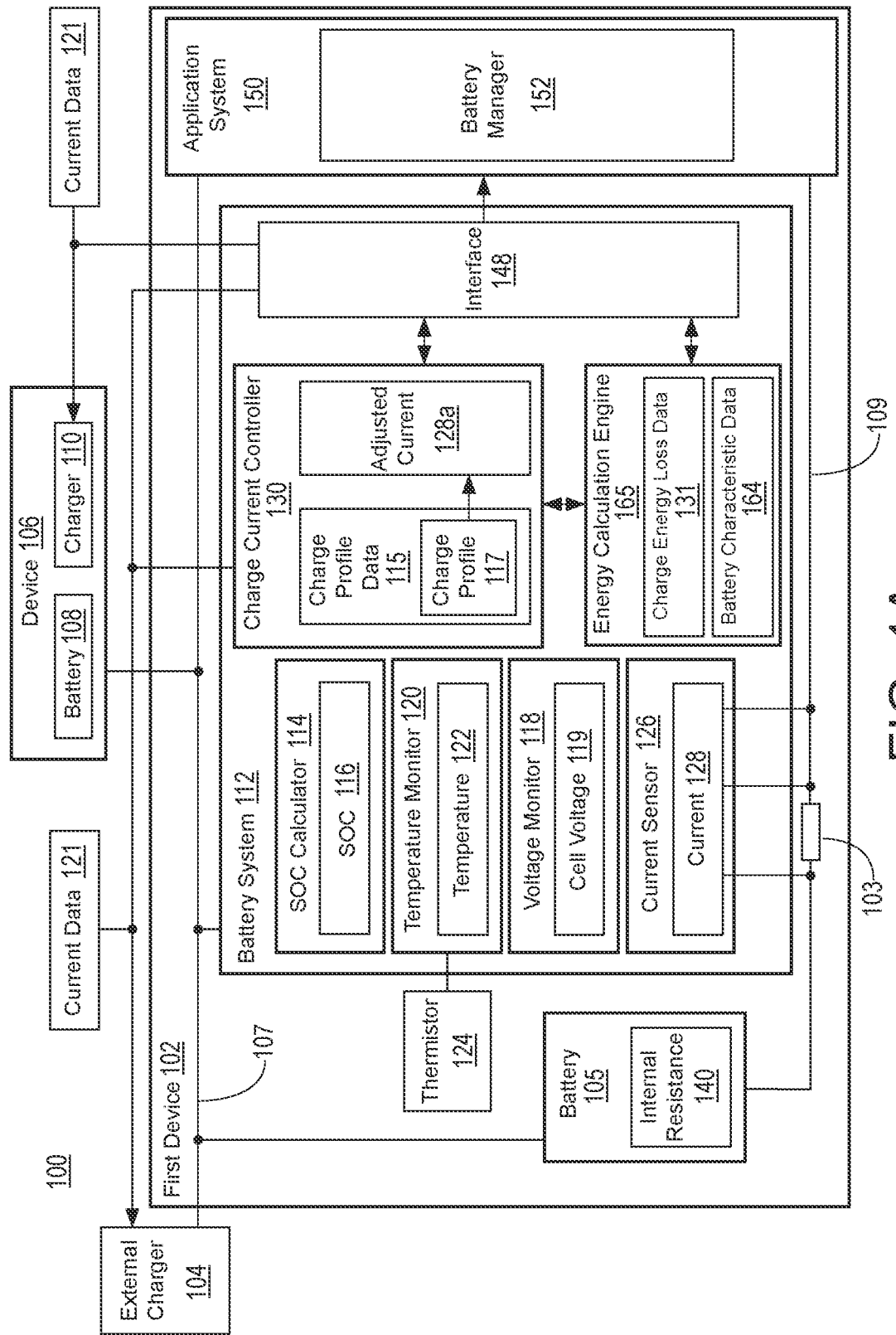
FIG. 1A illustrates a battery charging system having a first device with a first battery, a second device with a second battery, and an external charger according to an aspect.

The present disclosure relates to a first device having a battery system (e.g., a battery fuel gauge) that includes a charge current controller configured to adjust a charge current for a battery (first battery) of the first device according to a charge profile based on the first battery's measured temperature and computed state-of-charge (SoC) value, where the charge profile provides values for the charge current in a manner that reduces energy loss. In some examples, the charge current controller transmits current data to an external charger, where the current data indicates the value for the adjusted charge current to charge the first battery according to the charge profile. In some examples, the charge current controller transmits the current data to a second device with a second battery, where the first battery charges the second battery according to the adjusted charge current indicated by the current data.

The first device may include a rechargeable battery system. The first device's battery may be recharged using an external charger (e.g., a wall-charger, universal serial bus (USB) charger, etc.). In some examples, the first device includes a cradle charger. In some examples, the first device includes a holder charger. The second device (e.g., any type of device having a battery) may be coupled to the first device so that the second device's battery can be charged by the first device's battery. The first device may recharge the second device's battery multiple times before the first device's battery is required to be recharged. According to the embodiments discussed herein, the charge current controller may control the charging of the first device's battery by the external charger and/or the discharging of the first device's battery to charge the second device's battery in a manner that reduces energy loss. In some examples, the adjustment of the charge current during a charge or discharge event may cause the first device to be able to repeatedly recharge the second device's battery before the first device's battery is required to be recharged. In some examples, the first device can recharge the second device's battery (e.g., from 0% SoC to 100% SoC) more than five times before the first device's battery reaches 0% SoC. In some examples, the first device can recharge the second device's battery (e.g., from 0% SoC to 100% SoC) more than ten times before the first device's battery reaches 0%.

If the second device is a pair of earbuds and the first device is a charger cradle, the pair of earbuds may be inserted into the charger cradle such that energy is transferred from the charger cradle's battery to the earbuds' battery. Then, when the earbuds are charged, a user may use the earbuds until the earbuds' battery becomes depleted. The user may insert the earbuds into the charger cradle again so that the charger cradle can recharge the earbuds. The charger cradle may be able to recharge the earbuds multiple times before the charger cradle itself needs to be recharged by an external charger. The battery system within the first device (e.g., the charger cradle) may adjust the charge current such that the charger cradle's battery is charged by the external charger in a manner that reduces energy loss. Also, the battery system within the first device (e.g., the charger cradle) may adjust the charge current such that the earbuds' battery is charged by the charger cradle's battery in a manner that reduces energy loss. Although the above example is described in terms of earbuds/charger cradle, it is noted that the embodiments discussed herein may be applicable to any types of battery-powered devices.

The charge profile may provide an adjusted current having varying values during the charge or discharge operation. For example, instead of providing a relatively constant charge current to charge the first battery (e.g., charge operation) and/or a relatively constant charge current to charge the second battery using the first battery (e.g., discharge operation), the charge current controller may adjust the value of the charge current according to the charge profile so that energy losses during a charge or discharge operation are minimized. In some examples, the charge profile may define different values for the adjusted current during different time periods. In some examples, the adjusted current is increased during a first period of time, held constant during a second period of time, and decreased during a third period of time. In some examples, within the first period of time (e.g., 0% SoC (or 100% SoC) to X % SoC), the adjusted current is gradually increased. In some examples, within the second period of time (e.g., X % SoC to Y % SoC), the adjusted current is held at a relatively constant value. In some examples, within the third period of time (e.g., Y % to 100% (or 0%)), the adjusted current is gradually decreased.

In some examples, the charge profile data includes information that identifies which adjusted current value to use for a given SoC value and a temperature value in a manner that minimizes charge loss. In some examples, the charge profile data includes a plurality of charge profiles, where each charge profile relates to a different temperature value (or a different temperature range). For example, the charge profile data may include a first charge profile relating to a first temperature value (or a first temperature range), and a second charge profile relating to a second temperature value (or a second temperature range), and so forth. In some examples, a charge profile may provide the adjusted current values (or charge curve) across the SoC range. In some examples, the charge current controller may use the measured temperature to obtain the appropriate charge profile and use the calculated SoC value to obtain the corresponding adjusted current value from the charge profile. In a charge operation, the charge current controller may transmit the adjusted current value to the external charger so that the external charger provides the charge current to the first device's battery at the adjusted current value. In a discharge operation, the charge current controller may transmit the adjusted current value to the second device so that the first device's battery is discharged at the adjusted current value to charge the second device's battery.

The charge profiles may be optimized to minimize charge loss at the time of manufacture. In some examples, the battery system optimizes the charge profiles to minimize charge loss while the first device is in the field. The battery system may include an energy calculation engine configured to compute charge energy loss data using internal resistance values obtained from battery characteristic data. The battery characteristic data identifies values of the internal resistance for the first battery as a function of temperature values and/or SoC values. For example, the internal resistance may change based on the battery's temperature and/or SoC value. For relatively low temperatures, the internal resistance may be higher, thereby leading to higher charge energy loss.

In some examples, the battery characteristic data includes a look-up table that provides the battery's internal resistance for different values of temperature and SoC. The energy calculation engine may compute the charge energy loss data for a plurality of combinations of SoC values and temperature values based on $R(in) \times I_{DD} \times I_{DD} \times time$, where $R(in)$ is the battery's internal resistance obtained from the look-up table using the SoC value and/or the temperature, the current ($I_{DD}$) is the charging current, and the time is the sampling period. The charge current controller (or the energy calculation engine) may generate the charge profile, where the charge profile provides values for an adjusted current over SoC values and temperature values in a manner that reduces charge energy loss. The charge current controller (or the energy calculation engine) may identify values for the charge current ($I_{DD}$) that minimizes the charge energy loss.

The battery system may monitor actual charge energy loss of the first battery. For example, using measured values by the battery system (e.g., cell voltage, charging/discharging current, SoC value, temperature, etc.), the energy calculation engine may compute the actual charge energy loss caused by the internal resistance of the first battery during a charge operation and/or discharge operation. For instance, the charge energy loss computed by the energy calculation engine may be the actual charge energy loss caused by the battery's internal resistance.

The energy calculation engine may compute the actual charge energy loss caused by the internal resistance of the first battery based on a voltage difference $(\Delta V) \times I_{DD} \times time$, where $\Delta V$ is the voltage difference between OCV value and the cell voltage, the current ($I_{DD}$) is the current measured by a current sensor, and the time is a sampling period. If the charge mode is detected, $\Delta V$ is the cell voltage—OCV value. If the discharge mode is detected, $\Delta V$ is the OCV value—cell voltage. In some examples, $\Delta V$ is also equal to the internal resistance ($R(in)$) × the current ($I_{DD}$), where the charge energy loss is equal to $R(in) \times I_{DD} \times I_{DD} \times time$.

The energy calculation engine may compute actual charge energy of the first battery and total charge energy of the first battery during the sampling period, where a difference between the actual charge energy and the total charge energy may represent the actual charge energy loss caused by the internal resistance of the first battery. In some examples, the total charge energy may be computed based on cell voltage× $I_{DD}$×time, where the cell voltage is monitored by a voltage monitor, the current ($I_{DD}$) is monitored by the current sensor, and the time is the sampling period. In some examples, the actual charge energy of the first battery may be computed based on open-cell voltage (OCV)×$I_{DD}$×time, where the OCV value is derived from the computed SoC value using a look-up table, the current ($I_{DD}$) is measured by the current sensor, and the time is the sampling period. In some examples, the energy calculation engine may compute a difference between the total charge energy and the actual charge energy to determine the actual charge energy loss. In some examples, the battery system is configured to transmit the actual charge energy loss to a battery manager included on the first device.

The battery system may monitor estimated charge loss of the first battery. For example, the energy calculation engine may compute estimated charge loss using the information from the charge profile. For example, during the sampling period, the energy calculation engine may use the adjusted current from the charge profile and the internal resistance from the battery characteristic table to compute the estimated charge loss. For example, estimated charge loss may be computed based on $R(in) \times I_{DD} \times I_{DD} \times time$, where $R(in)$ is the internal resistance from the battery characteristic table, $I_{DD}$ is the adjusted current from the charge profile, and time is the sampling period. In some examples, the energy calculation engine transmits the estimated charge loss to the battery manager of the first device. The battery manager may compare the actual charge energy loss to the estimated charge loss, and if the difference between the estimated charge loss and the actual charge energy loss is greater than a threshold amount, the battery manager may generate a notification (e.g., an alert) that indicates that the battery characteristic data may need to be updated.

The battery system monitors charge energy loss of the first battery, where the charge energy loss relates to energy losses incurred if a non-adjusted current value is used. For example, the energy calculation engine may compute charge energy loss, which represents the charge energy loss if the first battery was charged (or discharged) using a set value for the charge current (e.g., a non-adjusted value) (and battery internal resistance). For example, if the first battery is configured to be charged at a constant 2A, the battery system may compute the charge energy loss at 2A. The charge energy loss may be computed based on $R(in) \times I_{DD} \times I_{DD} \times$ time, where R(in) is the internal resistance from the battery characteristic table, $I_{DD}$ is the set value for the charge current, and time is the sampling period. In some examples, the energy calculation engine may compute an improved energy loss, which is the difference between the charge energy loss and the estimated charge energy loss. In some examples, the energy calculation engine is configured to transmit the charge energy loss, the estimated charge energy loss, and/or the improved energy loss to the battery manager of the first device.

FIGS. 1A through 1I illustrate a system 100 having a first device 102, a second device 106, and an external charger 104. The first device 102 includes a battery 105. The second device 106 includes a battery 108. The battery 108 may be removably (selectively) connected to the battery 105. The first device 102 is configured to be connected to the external charger 104 such that the battery 105 is charged by the external charger 104 during a charge operation. Also, the second device 106 is configured to be connected to the first device 102 such that the battery 105 is discharged to charge the battery 108 during a discharge operation. In some examples, the second device 106 is placed into the first device 102. In some examples, the second device 106 is connected to the first device 102 via a charging cable. In some examples, the second device 106 is wirelessly connected to the first device 102. In some examples, the external charger 104 is a wall charger or USB charger. However, the external charger 104 may be any type of charger configured to transfer energy to the battery 105 to charge the battery 105.

The first device 102 may include a rechargeable battery system. In some examples, the first device 102 includes a cradle charger. In some examples, the first device 102 includes a holder charger. However, the first device 102 may include any type of device having a battery that is configured to charge another battery such as a portable computing device (e.g., smartphone, tablet, laptop, etc.). The second device 106 may be any type of device having a battery that is configured to be charged by another device. In some examples, the second device 106 includes earbuds. The first device 102 may recharge the battery 108 of the second device 106 multiple times before the battery 105 is required to be recharged. According to the embodiments discussed herein, the charging of the battery 105 of the first device 102 by the external charger 104 and/or the discharging of the battery 105 of the first device 102 to charge the battery 108 is controlled in a manner that reduces energy loss. In some examples, the adjustment of the charge current during a charge or discharge event may cause the first device 102 to be able to repeatedly recharge the battery 108 before the battery 105 is required to be recharged. In some examples, the first device 102 can recharge the battery 108 (e.g., from 0% SoC to 100% Soc) more than five times before the battery 105 reaches 0% SoC. In some examples, the first device 102 can recharge the battery 108 (e.g., from 0% SoC to 100% Soc) more than ten times before the battery 105 reaches 0%.

As shown in FIG. 1A, the first device 102 includes a battery 105, a battery system 112 coupled to the battery 105, and an application system 150 that receives information from the battery system 112 via an interface 148. In some examples, the application system 150 includes a host processor. In some examples, the battery system 112 is a battery fuel gauge. The battery 105 may include any type of rechargeable battery containing one or more battery cells. In some examples, the battery 105 may be a lithium ion (Li-ion) battery containing one or more Li-ion cells. In some examples, the battery 105 may be a nickel-based battery such as a nickel-cadmium (NiCd) battery or a nickel-metal hydride (NiMH) battery. Also, the battery 108 may include any type of rechargeable battery containing one or more battery cells. In some examples, the battery 108 may be a lithium ion (Li-ion) battery containing one or more Li-ion cells. In some examples, the battery 108 may be a nickel-based battery such as a nickel-cadmium (NiCd) battery or a nickel-metal hydride (NiMH) battery. In some examples, the battery 108 has a size that is smaller than a size of the battery 105.

The battery 105 defines an internal resistance 140. The internal resistance 140 may be defined as the opposition to the flow of current 128 within the battery 105. The internal resistance 140 may cause energy loss when charge energy is transferred from the external charger 104 to the battery 105 during the charge mode (or charging operation) or when charge energy is transferred from the battery 105 to the battery 108 during the discharge mode (or discharge operation). The battery 105 is coupled to the application system 150 via a power source line 107 (e.g., VDD) and a power source line 109 (e.g., VSS). The battery system 112 is coupled to the battery 105. The battery system 112 is coupled to the power source line 107 and the power source line 109. The battery system 112 includes an interface 148 configured to permit the battery system 112, the application system 150, the external charger 104, and the second device 106 to communicate with each other.

The battery system 112 may include a current sensor 126 that measures the current 128, where the current 128 is the current flowing in and out of the battery 105. As further explained below, when a charge current controller 130 is activated, the current 128 is the adjusted current 128a. In the charge mode, the current 128 may be considered a charging current. In the discharge mode, the current 128 may be considered a discharging current. The current sensor 126 may use a sense resistor 103 to measure the current 128 (e.g., $I_{DD}$) through the battery 105. In some examples, the battery system 112 includes a charge detector (not shown in FIGS. 1A through 1I) that detects whether the battery 105 in the charge mode or the discharge mode based on a direction of the current 128. The battery system 112 includes a temperature monitor 120 configured to operate in conjunction with a thermistor 124 to measure a temperature 122 associated with the battery 105. The battery system 112 includes a voltage monitor 118 that measures a cell voltage 119 of the battery 105. In some examples, the battery system 112 simultaneously monitors the current 128, the cell voltage 119, and the temperature 122.

The battery system 112 includes a state-of-charge (SoC) calculation engine 114 configured to calculate an SoC value 116. The SoC value 116 includes the level of charge of the battery 105 relative to its full capacity. A percentage of full capacity means that the battery 105 is charged to less than full capacity. The capacity of the battery 105 is the total amount of electrical charge a battery 105 is able to hold. In some examples, the SoC value 116 includes a percentage point (e.g., 0%=empty, 100%=full). The SoC calculation engine 114 may calculate the SoC value 116 based on coulomb counting such as measuring actual capacity by integrating its current 128 from completely full to completely empty (or vice-versa). However, the SoC calculation engine 114 may use other techniques to obtain the SoC value 116 such as voltage translation based on the cell voltage 119 or a combination of coulomb counting and voltage translation.

Figure 1B:
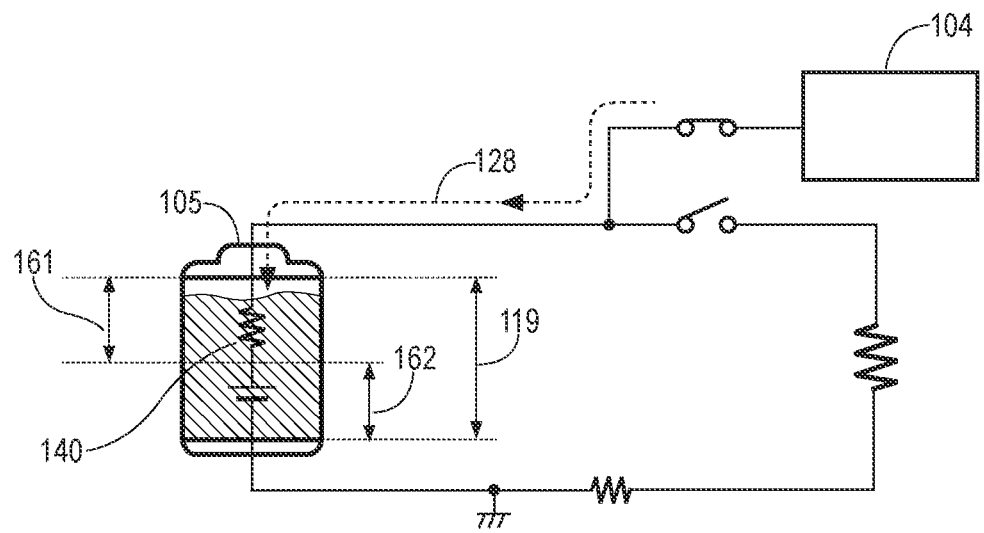
FIG. 1B illustrates a charge circuit for charging the first battery using the external charger according to an aspect.
Figure 1C:
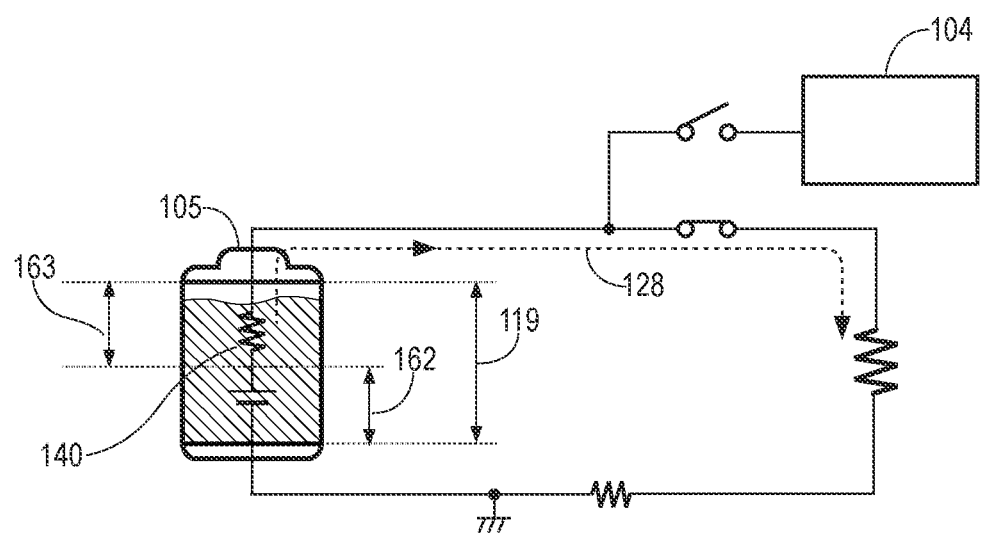
FIG. 1C illustrates a discharge circuit for discharging the first battery to charge the second battery according to an aspect.

FIG. 1B illustrates a charge circuit in which the battery 105 is charged by the flow of the current 128 from the external charger 104 to the battery 105. As shown in FIG. 1C, the load (e.g., the second device 106) is disconnected from the battery 105. Electrical energy is transferred from the external charger 104 to the battery 105 during the charge mode. During the charged mode, the internal resistance 140 of the battery 105 causes a voltage difference 161 between the cell voltage 119 and an open-cell voltage 162 (e.g., OCV value) during the charge mode, which causes energy losses. For example, the voltage difference 161 may be the current 128 multiplied by the internal resistance 140. The actual voltage of the battery 105 may be the open-cell voltage 162 plus (add) the product of the current 128 multiplied by the internal resistance 140 in the charge mode.

FIG. 1C illustrates a discharge circuit in which the current 128 flows from the battery 105 to the load (e.g., the second device 106). Electrical energy is transferred from the battery 105 to the second device 106 during the discharge mode. The internal resistance 140 of the battery 105 causes a voltage difference 163 between the cell voltage 119 and the open-cell voltage 162 during the discharge mode, which causes energy losses. The voltage difference 163 may be the current 128 multiplied by the internal resistance 140. The actual voltage of the battery 105 may be the open-cell voltage 162 minus the product of the current 128 multiplied by the internal resistance 140.

Figure 1D:
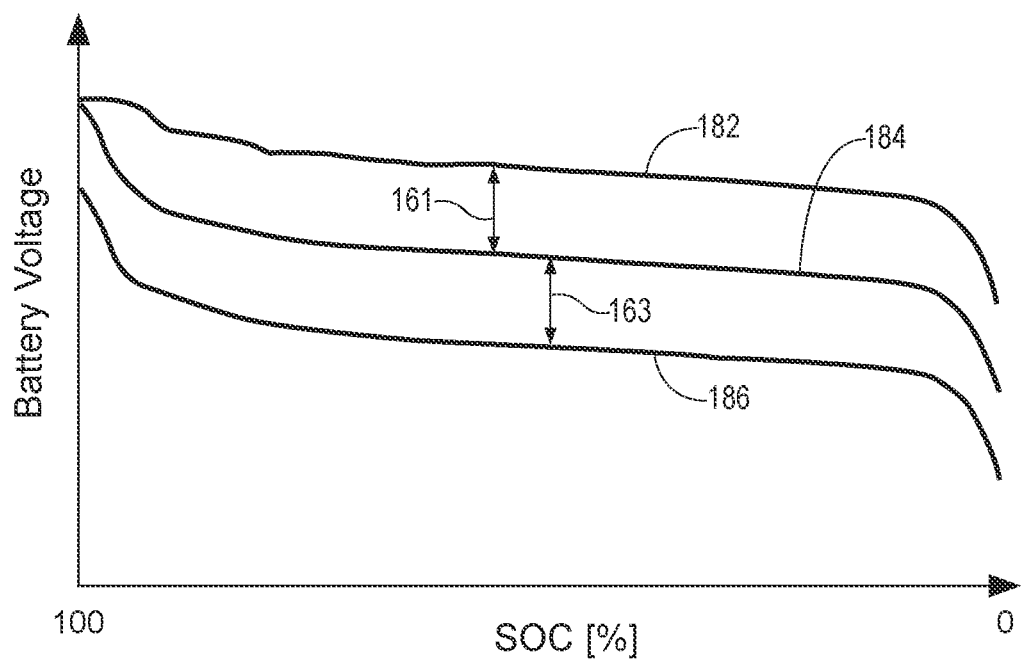
FIG. 1D illustrates a graph depicting battery voltage against state-of-charge values for a charge curve, an open-cell voltage curve, and a discharge curve according to an aspect.

FIG. 1D illustrates a graph depicting a charge curve 182, an open-cell voltage (OCV) curve 184, and a discharge curve 186, which depicts cell voltage against SoC. For example, the charge curve 182 depicts the cell voltage against decreasing values of SoC during the charge mode. The discharge curve 186 depicts the cell voltage against decreasing values of SoC during the discharge mode. The OCV curve 184 illustrates a level of the open-cell voltage. The difference between the charge curve 182 and the OCV curve 184 depicts the voltage difference 161 caused by the internal resistance 140 during the charged mode, and the voltage difference 161 creates energy losses during the charge mode. The difference between the discharge curve 186 and the OCV curve 184 depicts the voltage difference 163 caused by the internal resistance 140 during the discharge mode, and the voltage difference 163 creates energy losses during the discharge mode.

Referring back to FIG. 1A, the battery system 112 includes a charge current controller 130 configured to determine an adjusted current 128a for charging or discharging the battery 105 according to a charge profile 117 based on the measured temperature 122 and computed SoC value 116, where the charge profile 117 provides values for the adjusted current 128a in a manner that reduces the energy loss. In some examples, during the charge operation, the charge current controller 130 transmits current data 121 to the external charger 104, where the current data 121 indicates the value for the adjusted current 128a to charge the battery 105. In some examples, in the discharge operation, the charge current controller 130 transmits the current data 121 to the second device 106 in which a charger 110 associated with the second device 106 causes the battery 105 to charge the battery 108 according to the value of the adjusted current 128a indicated by the current data 121.

The charge current controller 130 includes charge profile data 115 that defines the charge profiles 117. In some examples, the charge profile data 115 includes information that identifies which value of the adjusted current 128a to use for a given SoC value 116 and a temperature 122 in a manner that minimizes charge loss. In some examples, the charge profile data 115 includes a plurality of charge profiles 117, where each charge profile 117 relates to a different temperature value (or a different temperature range). For example, the charge profile data 115 may include a first charge profile relating to a first temperature value (or a first temperature range), and a second charge profile relating to a second temperature value (or a second temperature range), and so forth.

A charge profile 117 may provide the adjusted current 128a (or charge curve) across the SoC range. The charge current controller 130 may use the measured temperature 122 to obtain a particular charge profile 117. For example, if the measured temperature 122 is 70 degrees Fahrenheit, the charge current controller 130 may obtain the charge profile 117 associated with 70 degrees Fahrenheit. The charge current controller 130 may use the calculated SoC value 116 to obtain the corresponding adjusted current value from the charge profile 117. For example, the charge profile 117 may provide different values for the adjusted current 128a for various SoC values 116. In particular, if the SoC value 116 is 10%, the charge current controller 130 may obtain the corresponding value for the adjusted current 128a from the charge profile 117. In the charging operation, the charge current controller 130 may transmit current data 121 having the value for the adjusted current 128a to the external charger 104 so that the external charger 104 provides the adjusted current 128a to the battery 105 (e.g., at the adjusted current value). In the discharge operation, the charge current controller 130 may transmit current data 121 having the value for the adjusted current 128a so that battery 105 is discharged at the adjusted current value to charge the battery 108.

Figure 1E:
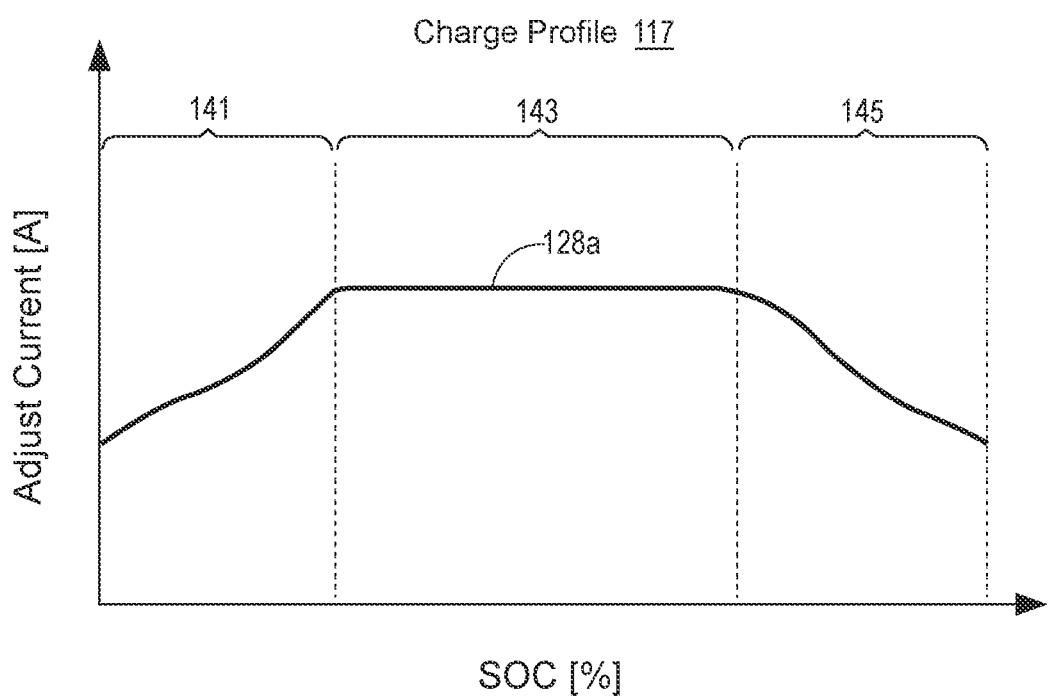
FIG. 1E illustrates a charge profile according to an aspect.

FIG. 1E illustrates an example of a charge profile 117 according to an aspect. In some examples, the charge profile 117 of FIG. 1E relates to a particular temperature or a temperature range. As shown in FIG. 1E, the charge profile 117 may define the adjusted current 128a over the range of SoC values.

The charge profile 117 may provide an adjusted current 128a having varying values during the charge or discharge operation. For example, instead of providing a relatively constant charge current to charge the battery 105 and/or a relatively constant charge current to charge the battery 108 using the battery 105, the charge current controller 130 may adjust the value of the charge current 128a according to the charge profile 117 so that energy losses during the charge or discharge operation are minimized.

In some examples, the charge profile 117 may define different values for the adjusted current 128a during different time periods. In some examples, the adjusted current 128a is increased during a first period of time 141. In some examples, the first period of time 141 is indicated by SoC levels, e.g., 0% SoC (or 100% SoC) to X % SoC, where X may be any SoC value between 1% and 99%. In some examples, the adjusted current 128a is gradually increased during the first period of time 141. In some examples, during the first period of time 141, the adjusted current 128a is increased linearly (e.g., increased at a single rate). In some examples, during the first period of time 141, the adjusted current 128a is non-linearly increased (e.g., increased at two or more different rates). In some examples, the adjusted current 128a is held at a relatively constant value during a second period of time 143. The second period of time 143 may be indicated by SoC levels, e.g., X % SoC to Y % SoC, where Y is greater or less than X. In some examples, during the second period of time 143, the adjusted current 128a is increased or decreased one or more times. In some examples, the adjusted current 128a is decreased during a third period of time 145. The third period of time 145 may be indicated by SoC levels, e.g., Y % SoC to 100% SoC (or 0% SoC). In some examples, the adjusted current 128a is gradually decreased during the third period of time 145. In some examples, during the third period of time 145, the adjusted current 128a is decreased linearly (e.g., decreased at a single rate). In some examples, during the third period of time 145, the adjusted current 128a is non-linearly decreased (e.g., decreased at two or more different rates).

The charge profile data 115 may be optimized to minimize charge loss at the time of manufacture. In some examples, the battery system 112 optimizes the charge profile data 115 to minimize charge loss while the first device 102 is in the field. The battery system 112 may include an energy calculation engine 165 configured to compute charge energy loss data 131 using internal resistance values obtained from battery characteristic data 164. In some examples, the battery characteristic data 164 identifies values of the internal resistance 140 for the battery 105 as a function of temperature 122 and/or SoC values 116. For example, the internal resistance 140 may change based on the battery's temperature 122 and/or SoC value 116. For relatively low temperatures 122, the internal resistance 140 may be higher, thereby leading to higher charge energy loss. Also, in some examples, the internal resistance 140 may have different values depending on the SoC value 116.

In some examples, the battery characteristic data 164 includes a look-up table that provides the battery's internal resistance 140 for different values of temperature 122 and SoC values 116. In some examples, the energy calculation engine 165 computes the charge energy loss data 131 for a plurality of combinations of SoC values 116 and temperatures 122 based on $R(in) \times I_{DD} \times I_{DD} \times time$, where R(in) is the battery's internal resistance 140 obtained from the battery characteristic data 164 using the SoC value 116 and/or the temperature 122, the current ($I_{DD}$) is the current 128, and the time is the sampling period. In some examples, the charge current controller 130 (or the energy calculation engine 165) may generate (and optimize) the charge profile data 115 defining the charge profiles 117 in which values for the adjusted current 128a are provided with respect to SoC values 116 and temperatures 122 in a manner that reduces charge energy loss. In some examples, the charge current controller 130 (or the energy calculation engine 165) may identify values for the adjusted current 128a that minimizes the charge energy loss.

Figure 1F:
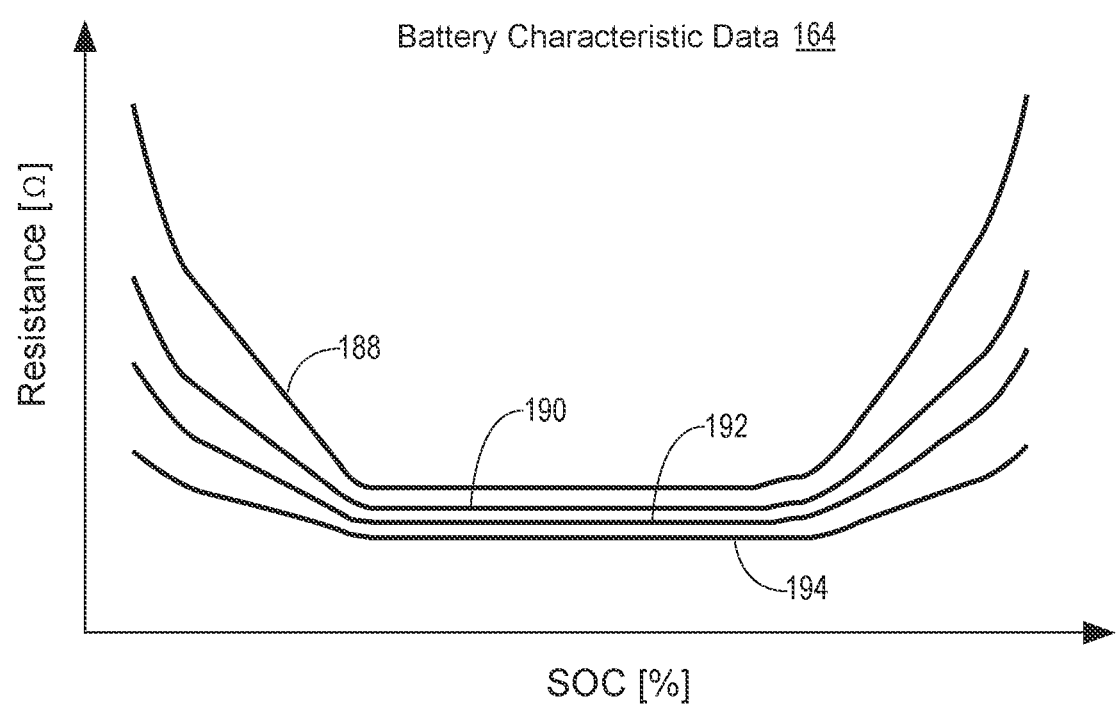
FIG. 1F illustrates an example of battery characteristic data according to an aspect.

As shown in FIG. 1F, the battery characteristic data 164 may include various values for the internal resistance 140 as a function of temperature and/or SoC. For example, FIG. 1F illustrates a graphical view of an internal resistance curve 188 corresponding to a first temperature (or first temperature range), an internal resistance curve 190 corresponding to a second temperature (or second temperature range), an internal resistance curve 192 corresponding to a third temperature (or third temperature range), and an internal resistance curve 194 corresponding to a fourth temperature (or fourth temperature range). However, the battery characteristic data 164 may provide internal resistances 140 for a range of temperatures. If the measured temperature 122 is the second temperature, value for the internal resistance 140 may be derived from the internal resistance curve 190 using the calculated SoC value 116.

Figure 1G:
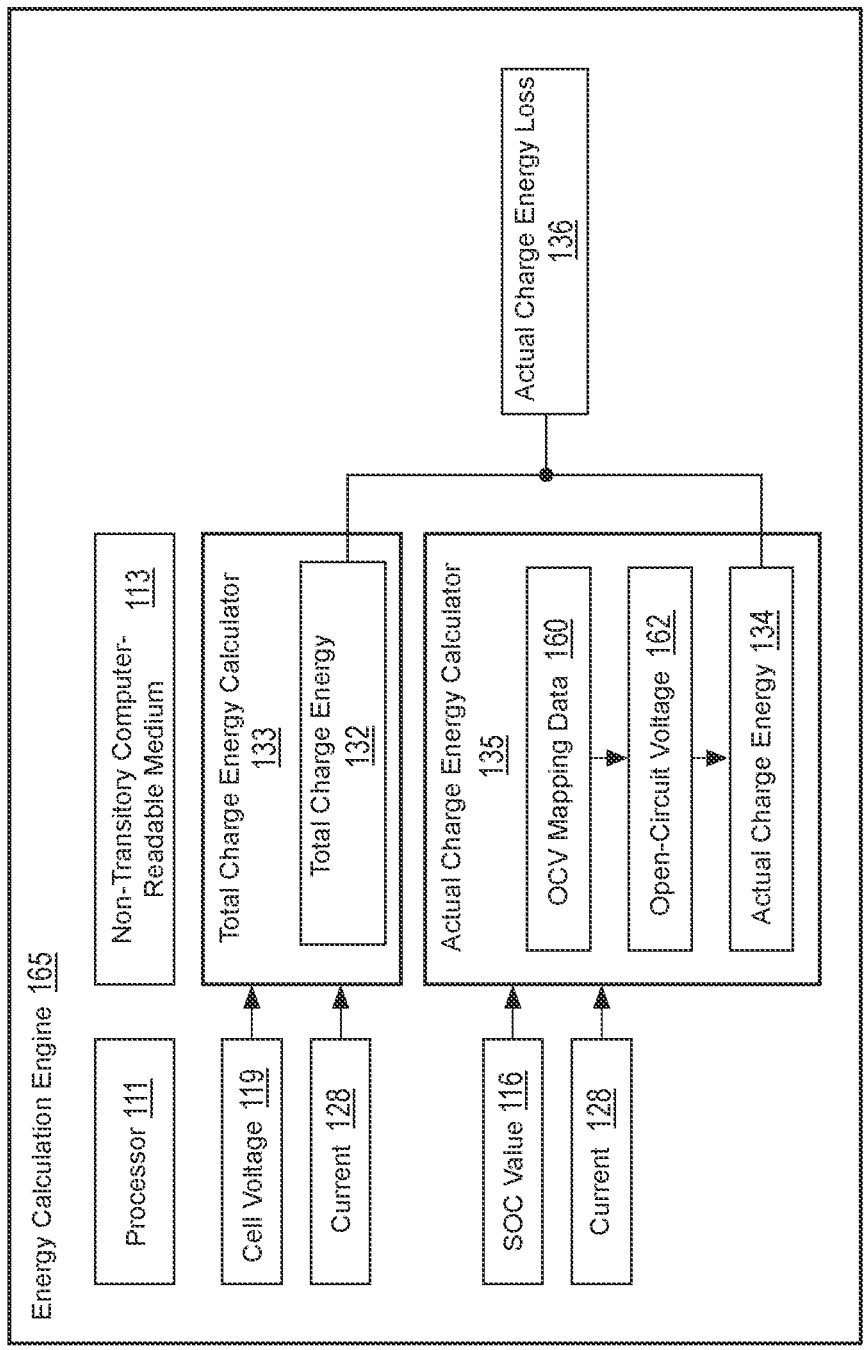
FIG. 1G illustrates an example of an energy calculation engine according to an aspect.

Referring to FIG. 1G, the battery system 112 may monitor actual charge energy loss 136. For example, using measured values by the battery system 112 (e.g., cell voltage 119, the current 128, SoC value 116, temperature 122, etc.), the energy calculation engine 165 is configured to compute the actual charge energy loss 136 caused by the internal resistance 140 of the battery 105 during the charge operation and/or discharge operation. For instance, the charge energy loss computed by the energy calculation engine 165 may be the actual charge energy loss 136 caused by the battery's internal resistance 140 in the charge operation (or the discharge operation). In some examples, the energy calculation engine 165 is configured to transmit the actual charge energy loss 136 to the battery manager 152 included on the first device 102.

As shown in FIG. 1G, the energy calculation engine 165 includes a processor 111 (e.g., a microcontroller), where the processor 111 is configured to execute instructions, which may be stored in a non-transitory computer-readable medium 113 to perform various actions, such as those described in this disclosure. The non-transitory computer-readable medium 113 may be any type of non-transitory storage medium that is used to store information used by the energy calculation engine 165 and instructions for execution by the energy calculation engine 165.

As shown in FIG. 1G, the energy calculation engine 165 may include a total charge energy calculator 133 configured to compute the total charge energy 132 for a sampling time (which may be indicated by a timer). For example, the total charge energy calculator 133 may receive the cell voltage 119 and the current 128 and compute the total charge energy 132 based on the cell voltage 119, the current 128, and the sampling time indicated by the timer (e.g., total charge energy=$(V_{cell\_voltage} * I_{DD}) * Time$).

The energy calculation engine 165 may include an actual charge energy calculator 135 configured to compute the actual charge energy 134 for the sampling period. For example, the actual charge energy calculator 135 may receive the SoC value 116 and the current 128 and compute the actual charge energy 134 based on the SoC value 116 and the current 128. The actual charge energy calculator 135 includes OCV mapping data 160. The OCV mapping data 160 may include table data that provides OCV values for various SoC values. The actual charge energy calculator 135 may obtain the appropriate value for the open-cell voltage 162 based on the SoC value 116 using the OCV mapping data 160. For example, the OCV mapping data 160 may define a first OCV value for a given first SoC value, a second OCV value for a given second SoC value, and a third OCV value for a given SoC value, and so forth. If the SoC value 116 is the second SoC value, the actual charge energy calculator 135 may obtain the second OCV value for the open-cell voltage 162. In some examples, the OCV mapping data 160 is included in the SoC calculation engine 114, and the energy calculation engine 165 receives the open-cell voltage 162 from the SoC calculation engine 114. The open-cell voltage 162 is used to calculate the actual charge energy 134. For example, the actual charge energy calculator 135 may compute the actual charge energy 134 based on the open-cell voltage 162, the current, and the sampling time indicated by the timer (e.g., actual charge energy= $(V_{OCV} * I_{DD}) * Time))$.

The energy calculation engine 165 may compute the actual charge energy loss 136 based on the total charge energy 132 and the actual charge energy 134. In some examples, in the discharge mode, the actual charge energy loss 136 may be referred to as discharge energy loss. For example, the energy calculation engine 165 computes the actual charge energy loss 136 based on a difference between the total charge energy 132 and the actual charge energy 134. With respect to the charge mode, the total charge energy 132 is the sum of the actual charge energy 134 and the actual charge energy loss 136. In the discharge mode, the actual charge energy 134 is the sum of the available discharge energy and the discharge energy loss.

In some examples, the energy calculation engine 165 is configured to compute the actual charge energy loss 136 caused by the internal resistance 140 of the battery 105 based on a voltage difference $(\Delta V) \times I_{DD} \times$ time, where $\Delta V$ is the difference between OCV value from the open-cell voltage 162 and the cell voltage 119, the current ($I_{DD}$) is the current 128 measured by the current sensor 126, and the time is a sampling period. If the charge mode is detected, $\Delta V$ is the cell voltage—OCV value (e.g., voltage difference 161). If the discharge mode is detected, $\Delta V$ is the OCV value—cell voltage (e.g., voltage difference 163). In some examples, $\Delta V$ is also equal to the internal resistance (R(in))×the current ($I_{DD}$), where the charge energy loss is equal to $R(in) \times I_{DD} \times I_{DD} \times$ time.

Figure 1H:
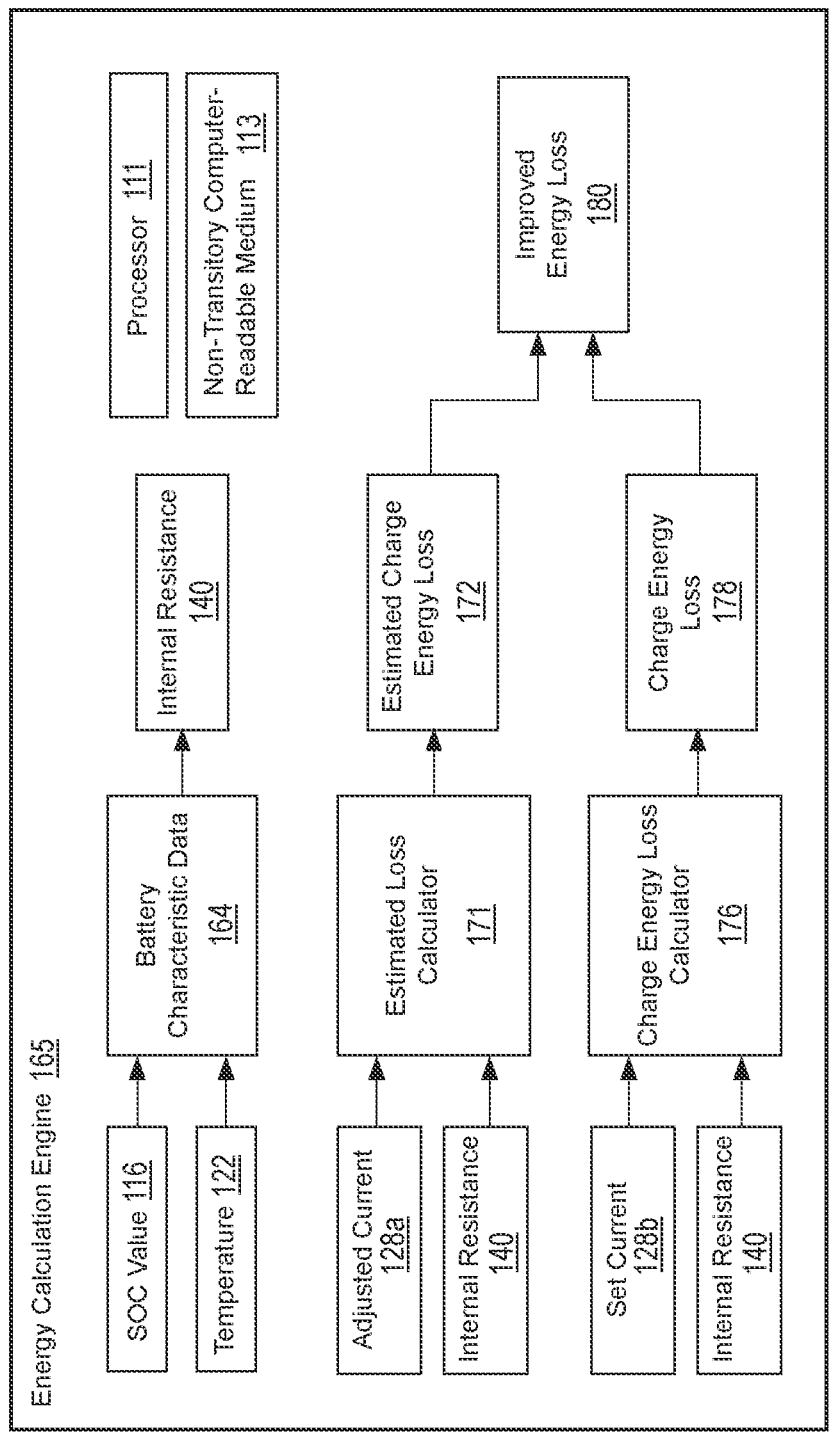
FIG. 1H illustrates an example of an energy calculation engine according to another aspect.
Figure 11:
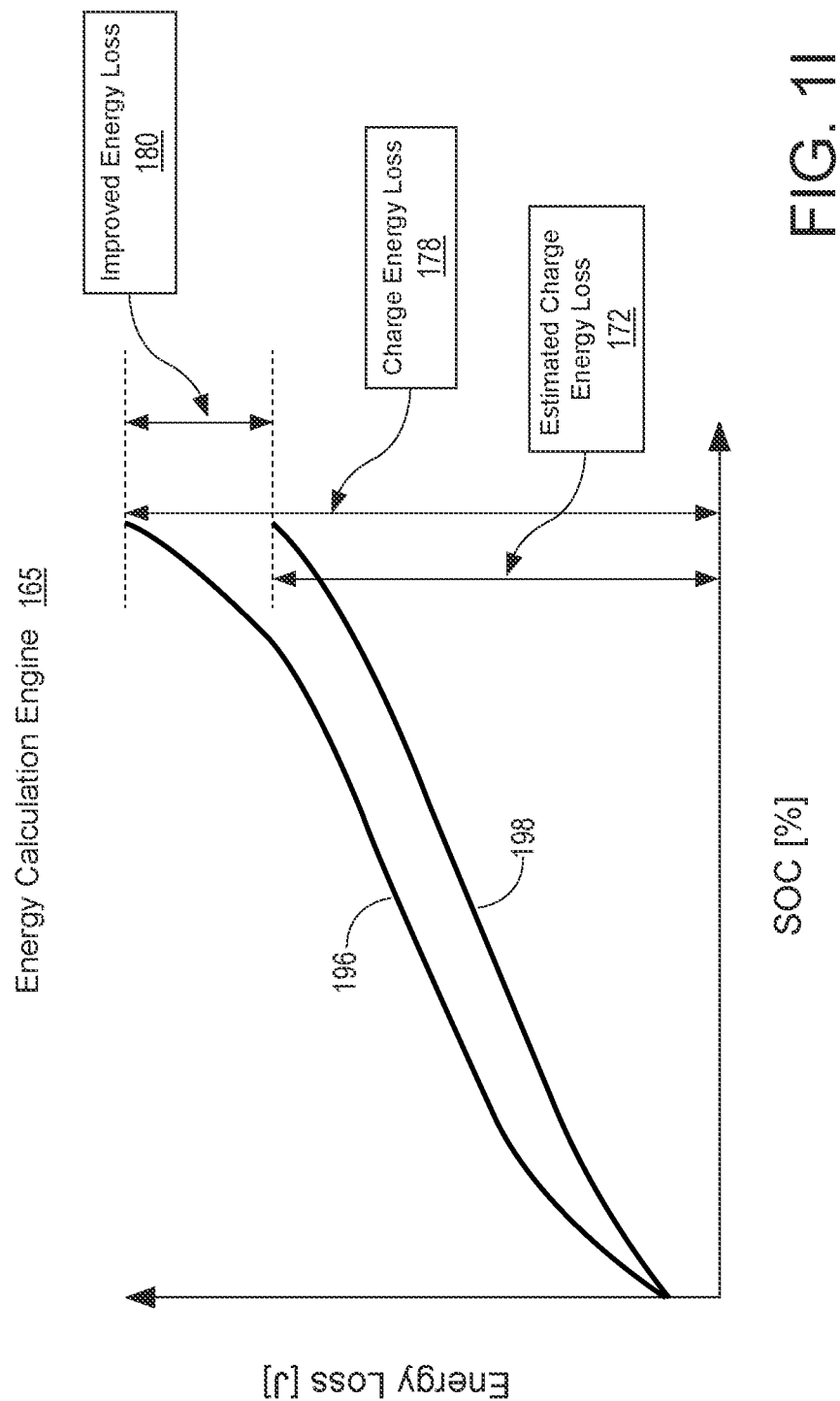

Referring to FIG. 1H, the battery system 112 may monitor estimated charge energy loss 172. The energy calculation engine 165 is configured to compute estimated charge energy loss 172 using the information from the charge profile 117. For example, the energy calculation engine 165 may include an estimated loss calculator 171 that uses the adjusted current 128a from the charge profile 117 and the internal resistance 140 from the battery characteristic data 164 to compute the estimated charge energy loss 172 for a sampling period. For example, the energy calculation engine 165 may use the SoC value 116 and the temperature 122 as inputs to the battery characteristic data 164 to obtain the internal resistance 140. Then, the estimated loss calculator 171 may compute the estimated charge energy loss 172 based on $R(in) \times I_{DD} \times I_{DD} \times$ time, where R(in) is the internal resistance 140 from the battery characteristic data 164, $I_{DD}$ is the adjusted current 128a from the charge profile 117, and time is the sampling period. In some examples, the energy calculation engine 165 transmits the estimated charge energy loss 172 to the battery manager 152 of the first device 102. In some examples, the battery manager 152 may compare the actual charge energy loss 136 to the estimated charge energy loss 172, and if the difference between the estimated charge energy loss 172 and the actual charge energy loss 136 is greater than a threshold amount, the battery manager 152 may generate a notification (e.g., an alert) that indicates that the battery characteristic data 164 may need to be updated.

The battery system 112 monitors charge energy loss 178 relating to the losses incurred if a non-adjusted current value is used. For example, the energy calculation engine 165 may include a charge energy loss calculator 176 that computes charge energy loss 178, which may represent the charge energy loss if the battery 105 was charged (or discharged) using a set current 128b (e.g., a non-adjusted current). For example, if the battery 105 is initially configured to be charged at 2 A, 2 A is the set current 128b, and the battery system is configured to compute the charge energy loss 178 at 2 A) (and battery internal resistance). The charge energy loss 178 may be computed based on $R(in) \times I_{DD} \times I_{DD} \times$ time, where R(in) is the internal resistance 140 from the battery characteristic data 164, $I_{DD}$ is the set current 128b, and time is the sampling period. Since the charge energy loss is based on the square of the current $I_{DD}$, the adjustment of the current has certain impact on total energy loss. In some examples, the energy calculation engine 165 is configured to compute an improved energy loss 180, which is the difference between the charge energy loss 178 and the estimated charge energy loss 172. In some examples, the energy calculation engine 165 is configured to transmit the charge energy loss 178, the estimated charge energy loss 172, and/or the improved energy loss 180 to the battery manager 152 of the first device 102.

FIG. 1I illustrates a graph depicting a first energy loss curve 196 associated with the set current 128b (e.g., non-adjusted current) and a second energy loss curve 198 associated with the adjusted current 128a over a range of SoC values. As shown in FIG. 1I, the charge energy loss 178 is shown with respect to the first energy loss curve 196, and the estimated charge energy loss 172 is shown with respect to the second energy loss curve 198. The difference between the first energy loss curve 196 and the second energy loss curve 198 depicts the improved energy loss 180.

The battery manager 152 may be configured to estimate a charging period that will be required to charge the battery 105 and/or the battery 108 from its current SoC value to full capacity using the adjusted current 128a. In addition, as explained above, the battery manager 152 may compare the actual charge energy loss 136 to the estimated charge energy loss 172, and if the difference between the estimated charge energy loss 172 and the actual charge energy loss 136 is greater than a threshold amount, the battery manager 152 may generate a notification (e.g., an alert) that indicates that the battery characteristic data 164 may need to be updated.

Figure 2A:
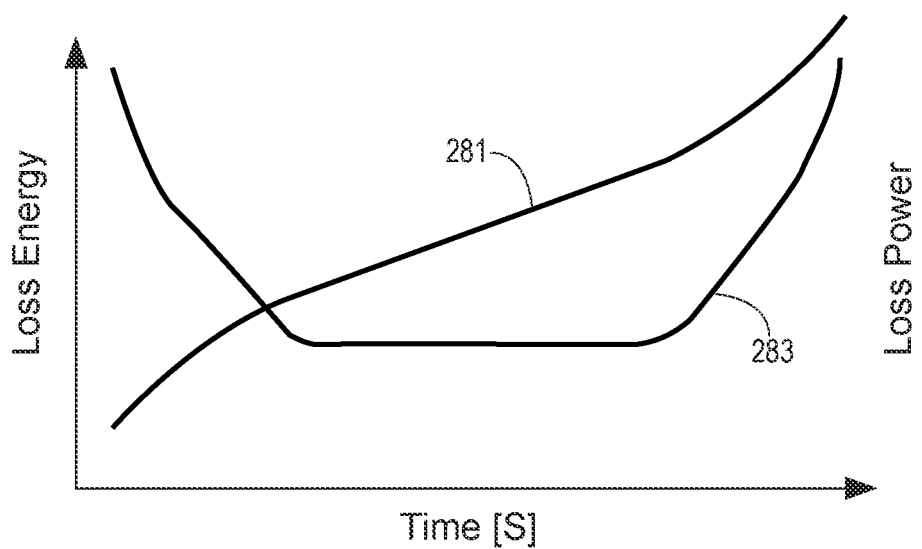
FIG. 2A illustrates a graph depicting loss power and loss energy for a non-adjusted current according to an aspect.
Figure 2B:
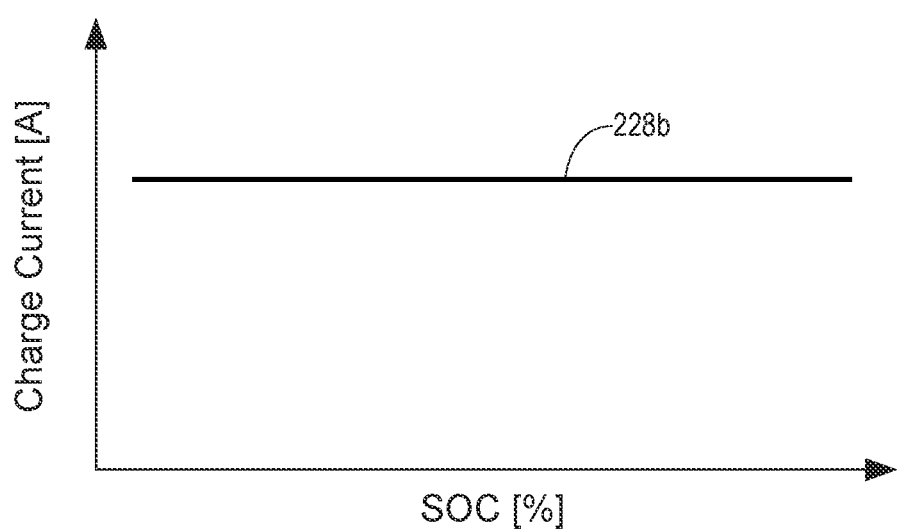
FIG. 2B illustrates a graph depicting the non-adjusted current according to an aspect.
Figure 3A:
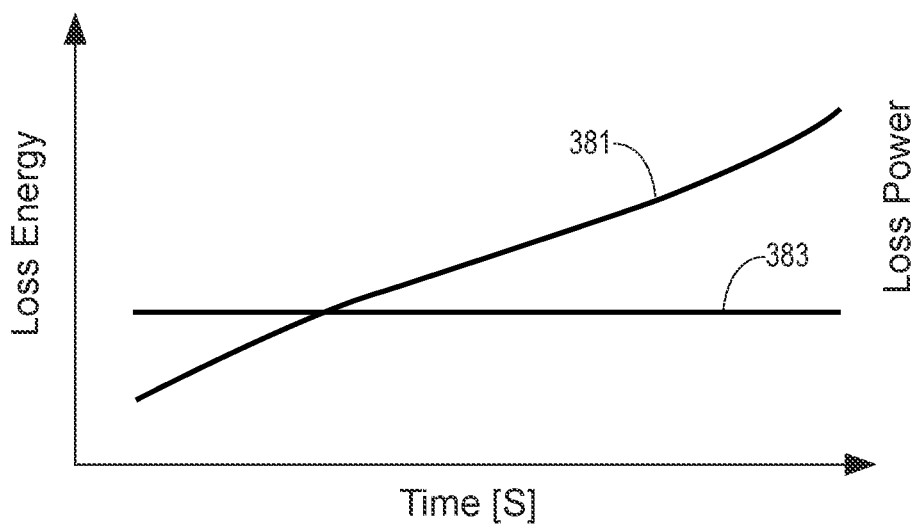
FIG. 3A illustrates a graph depicting loss power and loss energy for an adjusted current according to an aspect.
Figure 3B:
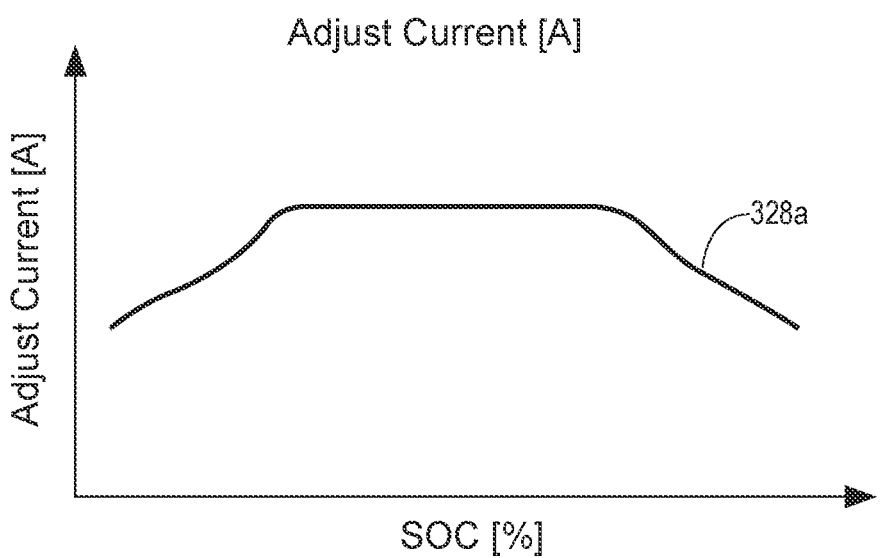
FIG. 3B illustrates a graph depicting the adjusted current according to an aspect.

FIGS. 2A and 2B depict a graph showing a loss energy curve 281 and loss power curve 283 for a set current 228b that does not change over time. FIGS. 3A and 3B depict a graph showing a loss energy curve 381 and a loss power curve 383 for an adjusted current 328a having values that change according to the curve of the adjusted current 328a depicted in FIG. 3B. The adjusted current 328a may be an example of the adjusted current 128a of FIGS. 1A through 1I. As shown on FIG. 3A, the energy loss and the power loss are reduced using the adjusted current 328a.

For example, the adjusted values of the adjusted current 328a may maintain power loss relatively constant as shown in the loss power curve 383 of FIG. 3A. With this approach, the power loss inside the battery (around the internal resistance) may be maintained relatively constant, and, in some examples, the unnecessary heat generation may become relatively constant (thereby minimizing or avoiding a temperature shift). For instance, the temperature shift by the unnecessary heat generation inside the battery towards the high side is an aging factor for the battery, and, in some examples, may cause damage to the battery.

In some examples, the adjusted charge 328a (as shown by the curve in FIG. 3B) is created (or generated) by the battery system 112 and/or the application system 150 (or both). In some examples, the adjusted current 328a is increased during a first period of time (e.g., SOC=0% to SOC=20%) when the internal resistance is decreased and the adjusted current 328a is decreased during a second period of time (e.g., SOC=80% to SOC=100%) when the internal resistance is decreased. These adjustment are executed in a manner such that the power loss around the battery internal resistance is maintained at a relatively constant level, where the adjusted current 328a is changed flexibly in accordance with battery internal resistance characteristic. In some examples, the system may create the adjusted current 328a in a manner that charges quickly at a lower capacity range by providing a high current during a first period (e.g. SOC=0% to SOC=50%) and charges more slowly at a higher capacity range by providing a lower current during a second period of time (e.g. SOC=50% to SOC=100%).

Figure 4:
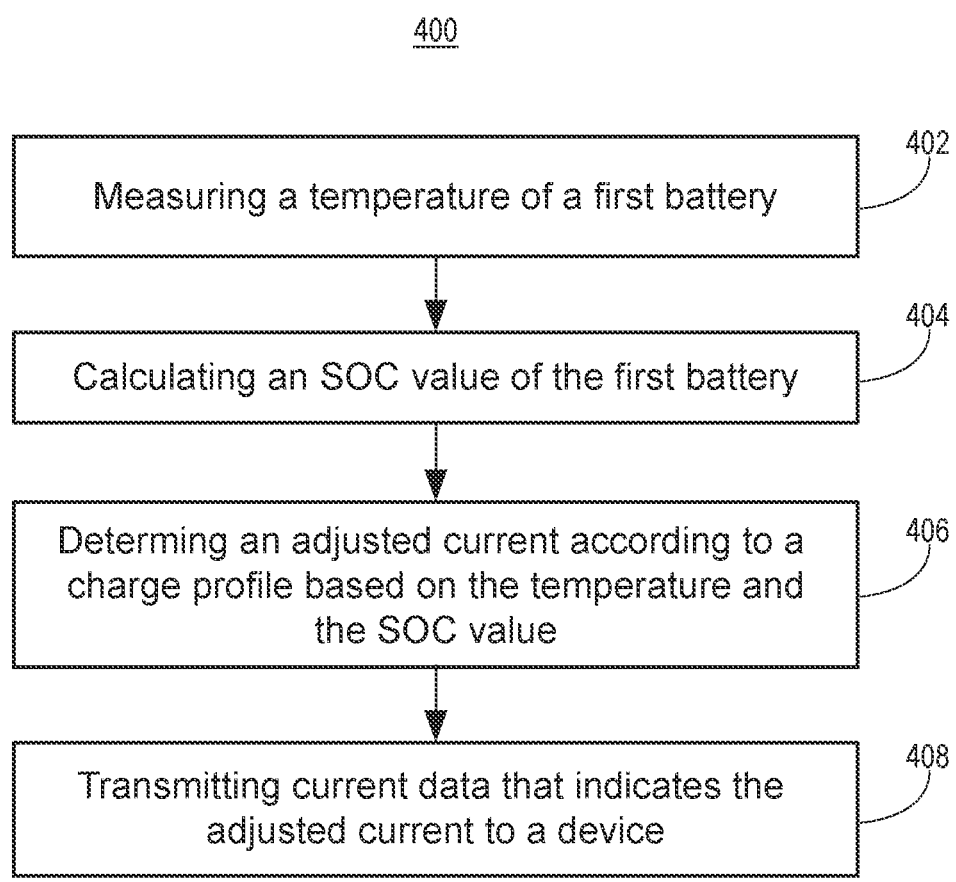
FIG. 4 illustrates a flowchart depicting example operations of a battery system for adjusting a battery current according to an aspect.

FIG. 4 depicts a flowchart 400 depicting example operations of a battery system for controlling a charging current. The flowchart 400 is explained with reference to the battery system 112 of FIGS. 1A through 1I. Although the flowchart 400 of FIG. 4 illustrates operations in sequential order, it will be appreciated that this is merely an example, and that additional or alternative operations may be included. Further, operations of FIG. 4 and related operations may be executed in a different order than that shown, or in a parallel or overlapping fashion.

Operation 402 includes measuring a temperature 122 of a first battery (e.g. battery 105). Operation 404 includes calculating an SoC value 116 of the first battery. Operation 406 includes determining an adjusted current 128a according to a charge profile 117 based on the temperature 122 and the SoC value 116. Operation 408 includes transmitting current data 121 that indicates the adjusted current 128a to a device (e.g., external charger 104 or second device 106).

Figure 5:
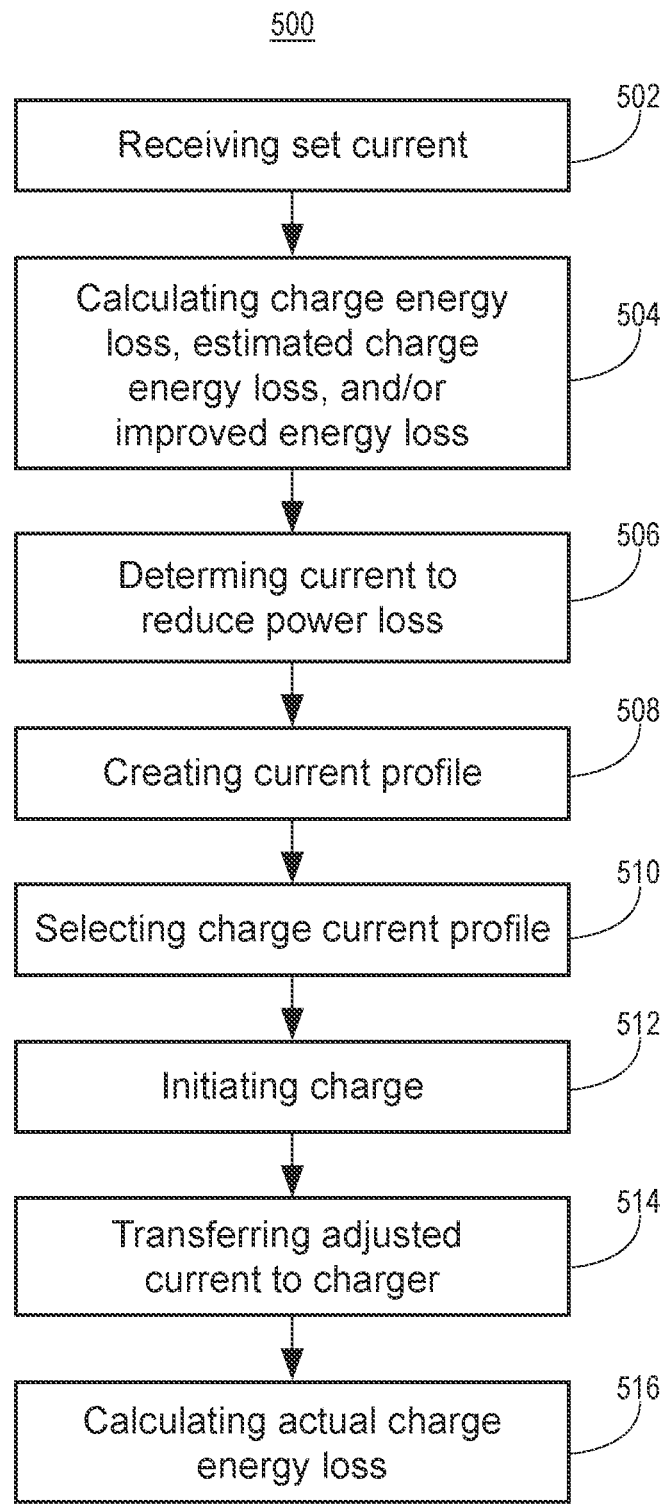
FIG. 5 illustrates a flowchart depicting example operations of a battery system for adjusting a battery current according to another aspect.

FIG. 5 depicts a flowchart 500 depicting example operations of a battery system for controlling a charging current. The flowchart 500 is explained with reference to the battery system 112 of FIGS. 1A through 1I. Although the flowchart 500 of FIG. 5 illustrates operations in sequential order, it will be appreciated that this is merely an example, and that additional or alternative operations may be included. Further, operations of FIG. 5 and related operations may be executed in a different order than that shown, or in a parallel or overlapping fashion.

Operation 502 includes receiving a set current 128b. Operation 504 includes calculating charge energy loss 178, estimated charge energy loss 172, and/or improved energy loss 180. Operation 506 includes determining (e.g., optimizing) current 128 to reduce (e.g., minimize) power loss (e.g., determining the values for the adjusted current 128a). Operation 508 includes creating a current profile 117. For example, the current profile 117 is created using the adjusted current 128a, which may maintain a relatively constant power loss at battery internal resistance during operation. Operation 510 includes selecting a charge profile 117. Operation 512 includes initiating charge. Operation 514 includes transferring adjusted current 128a to a charger (e.g., external charger 104 or a charger 110 of a second device 106). For example, the battery system 112 may create current data 121 that includes the adjusted current 128 to be used by the external charger 104 or the charger 110 of the second device 106. Operation 516 including calculating actual charge energy loss 136.

It will be understood that, in the foregoing description, when an element is referred to as being connected to, electrically connected to, coupled to, or electrically coupled to another element, it may be directly connected or coupled to the other element, or one or more intervening elements may be present. In contrast, when an element is referred to as being directly connected to or directly coupled to another element, there are no intervening elements. Although the terms directly connected to, or directly coupled to may not be used throughout the detailed description, elements that are shown as being directly connected or directly coupled can be referred to as such. The claims of the application, if any, may be amended to recite exemplary relationships described in the specification or shown in the figures. Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A battery system comprising:
a temperature sensor configured to detect a temperature of a battery;
a state-of-charge (SoC) calculation engine configured to calculate an SoC value of the battery;
a charge current controller configured to determine an adjusted current according to a charge profile based on the temperature and the SoC value, the charge current controller configured to transmit current data that indicates the adjusted current to a device;
an energy calculation engine configured to:
compute estimated charge energy loss based on an internal resistance of the battery and the adjusted current from the charge profile; and
compute actual charge energy loss for the battery for a sampling period based on the SoC value, a cell voltage of the battery detected by a voltage monitor, and a current detected by a current sensor; and
a battery manager configured to generate an alert based on a comparison of the estimated charge energy loss with the actual charge energy loss.

2. The battery system of claim 1, wherein the device is an external charger configured to charge the battery according to the charge profile.

3. The battery system of claim 1, wherein the battery is a first battery, the device including a second battery in which the second battery charges the first battery according to the charge profile.

4. The battery system of claim 1, wherein the energy calculation engine is configured to compute charge energy loss data using internal resistance values obtained from battery characteristic data,
wherein the charge current controller is configured to generate the charge profile based on the charge energy loss data.

5. The battery system of claim 1, wherein the energy calculation engine is configured to transmit the actual charge energy loss to the battery manager.

6. The battery system of claim 5, wherein the energy calculation engine is configured to:

derive an open-cell voltage from the SoC value; and
compute the actual charge energy loss based on the current detected by the current sensor and a difference between the cell voltage and the open-cell voltage.

7. The battery system of claim 5, wherein the energy calculation engine is configured to:
derive an open-cell voltage from the SoC value;
compute actual charge energy of the battery based on the open-cell voltage and the current detected by the current sensor;
compute total charge energy of the battery based on the cell voltage and the current detected by the current sensor; and
compute the actual charge energy loss based on the actual charge energy and the total charge energy.

8. The battery system of claim 1, wherein the energy calculation engine is configured to derive an internal resistance of the battery from battery characteristic data using the SoC value and the temperature.

9. The battery system of claim 8, wherein the energy calculation engine is configured to:
compute energy loss of the battery based on the internal resistance and a set value for a charge current;
compute improved energy loss based on the estimated charge energy loss and the energy loss; and
transmit the improved energy loss to the battery manager.

10. The battery system of claim 1, wherein the charge profile is one of a plurality of charge profiles, each of the plurality of charge profiles corresponds to a separate temperature range, the charge current controller is configured to select the charge profile with a temperature range that includes the temperature detected by the temperature sensor, the charge current controller is configured to select a value for the adjusted current from the charge profile that corresponds to the SoC value.

11. A device comprising:
a battery;
a temperature sensor configured to detect a temperature of the battery;
a state-of-charge (SoC) calculation engine configured to calculate an SoC value of the battery;
a charge current controller configured to determine an adjusted current according to a charge profile based on the temperature and the SoC value, the charge current controller configured to transmit current data that indicates the adjusted current to a secondary device;
an energy calculation engine configured to:
derive an internal resistance of the battery from battery characteristic data using the SoC value and the temperature;
compute estimated charge energy loss for the battery based on the internal resistance and the adjusted current of the charge profile; and
compute actual charge energy loss for the battery for a sampling period based on the SoC value, a cell voltage of the battery detected by a voltage monitor, and a current detected by a current sensor; and
a battery manager configured to generate an alert based on a comparison of the estimated charge energy loss with the actual charge energy loss.

12. The device of claim 11, wherein the energy calculation engine is configured to compute charge energy loss data using internal resistance values obtained from the battery characteristic data,
wherein the charge current controller is configured to generate the charge profile based on the charge energy loss data.

13. The device of claim 11, wherein the battery manager is configured to receive, via an interface, the actual charge energy loss.

14. The device of claim 13, wherein the energy calculation engine is configured to:
derive an open-cell voltage from the SoC value; and
compute the actual charge energy loss based on the current detected by the current sensor and a difference between the cell voltage and the open-cell voltage.

15. A method comprising:
detecting a temperature of a first battery;
calculating an SoC value of the first battery;
determining an adjusted current according to a charge profile based on the temperature and the SoC value;
transmitting current data that indicates the adjusted current to a device, the device being an external charger or an electronic device having a second battery;
deriving an internal resistance of the first battery from battery characteristic data using the SoC value and the temperature;
computing estimated charge energy loss for the first battery based on the internal resistance and the adjusted current of the charge profile;
computing actual charge energy loss for the first battery for a sampling period based on the SoC value, a cell voltage of the first battery detected by a voltage monitor, and a current detected by a current sensor; and
generating an alert based on a comparison of the estimated charge energy loss with the actual charge energy loss.

16. The method of claim 15, further comprising:
deriving an open-cell voltage from the SoC value; and
computing the actual charge energy loss based on the current detected by the current sensor and a difference between the cell voltage and the open-cell voltage.

17. The method of claim 15, further comprising:
increasing the adjusted current during a first period of time; and
decreasing the adjusted current during a second period of time, the second period time being separated from the first period of time by a third period of time.

18. The method of claim 17, wherein the adjusted current is increased at two or more different charging rates during the first period of time.

19. The method of claim 17, further comprising:
maintaining the adjusted current during the third period of time.

20. The method of claim 17, further comprising:
decreasing the adjusted current during the third period of time.

* * * * *